United States Patent [19]

Ogawa

[11] Patent Number: 5,485,427
[45] Date of Patent: *Jan. 16, 1996

[54] DYNAMIC RANDOM ACCESS MEMORY DEVICE EQUIPPED WITH DUMMY CELLS IMPLEMENTED BY ENHANCEMENT TYPE TRANSISTORS

[75] Inventor: Sumio Ogawa, Tokyo, Japan

[73] Assignee: NEC Corporation, Tokyo, Japan

[ * ] Notice: The term of this patent shall not extend beyond the expiration date of Pat. No. 5,371,707.

[21] Appl. No.: 294,963

[22] Filed: Aug. 24, 1994

Related U.S. Application Data

[63] Continuation of Ser. No. 10,162, Jan. 28, 1993, Pat. No. 5,371,707.

[30] Foreign Application Priority Data

Jan. 30, 1992 [JP] Japan ..................... 4-40326

[51] Int. Cl.[6] .................................. G11C 7/00
[52] U.S. Cl. .................. 365/210; 365/190; 365/205; 365/208
[58] Field of Search .................. 365/210, 190, 365/205, 208

[56] References Cited

U.S. PATENT DOCUMENTS

| | | | |
|---|---|---|---|
| 4,669,063 | 5/1987 | Kirsch | 365/149 |
| 4,853,897 | 8/1989 | Nogami et al. | 365/189.11 |
| 4,947,376 | 8/1990 | Arimoto et al. | 365/205 |

FOREIGN PATENT DOCUMENTS 60-177495 9/1985 Japan.
3-117113 5/1991 Japan.

Primary Examiner—David C. Nelms
Assistant Examiner—Andrew Q. Tran
Attorney, Agent, or Firm—Sughrue, Mion, Zinn, Macpeak & Seas

[57] ABSTRACT

A shared sense amplifier circuit incorporated in a dynamic random access memory device is coupled at input/output nodes with dummy cells implemented by n-channel enhancement type field effect transistors for pulling one of the input/output nodes down upon access to one of the memory cells, and one of the enhancement type dummy cells rapidly turns off so that undershoot takes place at the associated input/output node due to channel resistance between the shared sense amplifier circuit and a bit line pair, thereby enlarging differential voltage applied between the input/output nodes of the shared sense amplifier circuit.

3 Claims, 12 Drawing Sheets

DYNAMIC RANDOM ACCESS MEMORY DEVICE EQUIPPED WITH DUMMY CELLS IMPLEMENTED BY ENHANCEMENT TYPE TRANSISTORS

This is a continuation of application Ser. No. 08/010,162 filed Jan. 28, 1993, now U.S. Pat. No. 5,371,707, issued Dec. 6, 1994.

FIELD OF THE INVENTION

This invention relates to a dynamic random access memory device and, more particularly, to a dynamic random access memory device equipped with dummy cells coupled with shared sense amplifier circuits.

DESCRIPTION OF THE RELATED ART

An electronic system is fabricated from a large number of semiconductor integrated circuit devices. Several semiconductor integrated circuits form a data storage of the electronic system, and the memory capacity of each device relates to the occupation area of the data storage and, accordingly, to the volume of the electronic system. For this reason, progressive efforts are made on semiconductor memory devices with larger memory capacity, and dynamic random access memory devices are developed at high annual rate. However, if dynamic random access memory cells are designed in accordance with 0.5 micron design rules, sense amplifier circuits are hardly scaled down together with the memory cells, and a shared sense amplifier circuit is proposed. The shared sense amplifier circuit is associated with two bit line pairs, and is selectively coupled with an accessed memory cell. This feature is attractive, because each shared sense amplifier circuit for each bit line pair is decreased to a half of a sense amplifier circuit individually associated with a bit line pair.

A typical example of the dynamic random access memory devices equipped with shared sense amplifier circuits is illustrated in FIG. 1 of the drawings. Although the dynamic random access memory device has a large number of columns of memory cells, FIG. 1 shows only one column of memory cells 1 and a dummy cell driving circuit 2 shared between all of the columns of memory cells for the sake of simplicity. The column of memory cells 1 is split into a first section and a second section, and a sense amplifier circuit 1a and a data transfer gate circuit 1b are shared between the first and second sections.

The first section comprises a first memory cell array 1c, a first transfer gate unit 1d and a first bit line pair BLP1 consisting of a left bit line BLf and a right bit line BLr. The first memory cell array 1c is fabricated from dynamic random access memory cells, and each of the dynamic random access memory cells is implemented by a series combination of an n-channel enhancement type switching transistor SW1 and a storage capacitor CP1. The n-channel enhancement type switching transistors SW1 of the respective dynamic random access memory cells are selectively coupled with the left and right bit lines BLf and BLr, however, FIG. 1 shows only one of the dynamic random access memory cells associated with a word line WLM. CPf and CPr stand for parasitic capacitances respectively coupled with the left and right bit lines BLf and BLr. The first transfer gate circuit 1d has two n-channel enhancement type switching transistors Qn1 and Qn2 respectively coupled between the left and right bit lines BLf and BLr and a pair of input/output nodes N1 and N2 of the sense amplifier circuit 1a, and the two n-channel enhancement type switching transistors Qn1 and Qn2 are responsive to a gate control signal on a control signal line TGM.

Similarly, the second section comprises a second memory cell array 1e, a second transfer gate unit 1f and a second bit line pair BLP2 also consisting of a left bit line BLf and a right bit line BLr. The second memory cell array 1e is fabricated from dynamic random access memory cells each implemented by a series combination of the n-channel enhancement type switching transistor SW1 and the storage capacitor CP1, only one of the memory cell associated with a word line WLP is shown for the same reason as the first memory cell array 1c. Although only one dynamic random access memory cell is coupled with the right bit line BLr, a large number of dynamic random access memory cells are incorporated in the second memory cell array 1e, and are selectively coupled with the left and right bit lines BLf and BLr. CPf and CPr also stand for parasitic capacitances respectively coupled with the left and right bit lines BLf and BLr of the second bit line pair BLP2. The second transfer gate circuit 1f has two n-channel enhancement type switching transistors Qn3 and Qn4 respectively coupled between the left and right bit lines BLf and BLr and the pair of input/output nodes N1 and N2 of the sense amplifier circuit 1 a as similar to the first transfer gate circuit 1d, and the two n-channel enhancement type switching transistors Qn3 and Qn4 are responsive to a gate control signal on a control signal line TGP.

The sense amplifier circuit 1a comprises two series combinations of n-channel enhancement type variable load transistors Qn4 and Qn5 and p-channel enhancement type variable load transistors Qp6 and Qp7 coupled in parallel between a first power supply line SAN and a second power supply line SAP, and the input/output nodes N1 and N2 are respectively coupled through a common drain node N3 with the gate electrodes of the variable load transistors Qn5 and Qp7 and through a common drain node N4 with the gate electrodes of the variable load transistors Qn4 and Qp6. When low and high power voltage levels are respectively applied to the power supply lines SAN and SAP, the sense amplifier circuit 1a is activated so as to develop small differential voltage between the input/output nodes N1 and N2. SDTO and SDNO designate a pair of sense amplifier lines. The data transfer circuit 1b is constituted by two n-channel enhancement type switching transistors Qn8 and Qn9 coupled between the input/output nodes N1 and N2 and a data transfer lines IOT and ION, and are concurrently responsive to a decoded signal YSW indicative of the column address assigned to an accessed memory cell.

The dummy cell driving circuit 2 aims at pulling down either bit line coupled with non-accessed memory cell for producing small differential voltage between the left and right bit lines BLf and BLr, and largely comprises a dummy word line driving circuit 2a and dummy cells or dummy capacitors Qdw0d and Qdw1d each implemented by an n-channel depletion type field effect transistor. The dummy word line driver circuit 2a has a decoder section 2b and driver section 2c for selectively driving dummy word lines DW0 and DW1, and the dummy word lines DW0 and DW1 are coupled with the dummy capacitors Qd0d and Qd1d, respectively. CPw0 and CPw1 are representative of parasitic capacitances respectively coupled with the dummy word lines DW0 and DW1.

The decoder section 2b comprises two NAND gates NA0 and NA1 and inverters IV0 and IV1, and the NAND gates NA0 and NA1 are concurrently enabled with an enable signal DWE upon an individual access to data bits stored in the dynamic random access memory device. Predecoded address signals XOr and XOf indicative of a row address assigned to the accessed memory cell are supplied to the NAND gates NA0 and NA1, respectively, and one of the NAND gates NA0 and NA1 shifts the output node thereof to logic "0" level. However, the other of the NAND gates NA0 and NA1 allows the output node thereof to remain in logic "1" level. The logic levels at the output nodes are indicative of either bit line BLf or BLr coupled with non-accessed memory cell. The logic levels at the output nodes of the NAND gates NA0 and NA1 are inverted by the associated inverters IV0 and IV1, and the inverters IV0 and IV1 supply the complementary logic levels to output inverters forming in combination the output driver circuit 2c. The inverters IV0 and IV1 and the output inverters twice invert the logic levels at the output nodes of the NAND gates NA0 and NA1 so as to specify either bit line BLf or BLr coupled with the non-accessed memory cell, and either dummy capacitor Qdw0d or Qdw1d regulates the associated bit line coupled with the non-accessed memory cell to the intermediate voltage level.

The prior art dynamic random access memory device thus arranged behaves upon access to a dynamic random access memory cell as follows. Assuming now that the row and column address signals are indicative of the row address and the column address assigned to the memory cell of the second memory cell array 1e, a precharge circuit (not shown) charges and equalizes the bit lines BLf and BLr to the intermediate voltage level Vcc/1 between high voltage level indicative of a data bit of logic "1" level and low voltage level indicative of a data bit of logic "0" level. After the precharging, the control signal on the signal line TGM goes down so that the n-channel enhancement type switching transistors Qn1 and Qn2 turn off, thereby blocking the sense amplifier circuit 1a from the first bit line pair BLP1. However, the second transfer gate circuit 1f keeps conduction paths between the second bit line pair BLP2 and the sense amplifier circuit 1a.

Subsequently, the word line WLP goes up to the high voltage level so that the n-channel enhancement type switching transistor SW1 turns on. The data bit stored in the storage capacitor CP1 is assumed to be logic "1" level corresponding to the high voltage level. The associated storage capacitor CP1 is conducted through the switching transistor SW1 with the right bit line BLr, and the data bit stored in the accessed memory cell causes the right bit line BLr to slightly go up, thereby producing small differential voltage between the left bit line BLf and the right bit line BLr. The decoder section 2b specifies the dummy word line DW1, and the dummy capacitor Qdw1d slightly pulls down the left bit line BLf immediately after the read-out of the accessed data bit. This results in that the small differential voltage is expanded by the dummy capacitor Qdw1d.

Subsequently, the power voltage lines SAN and SAP activates the sense amplifier circuit 1a so as to develop the small differential voltage between the left and right bit lines BLf and BLr into large differential voltage.

Finally, the decoded signal line YSN goes up so that the transfer gate circuit 1b couples the input/output nodes N1 and N2 with the data lines IOP and ION, and the large differential voltage indicative of the accessed data bit is transferred through the data lines IOP and ION to an output data buffer circuit (not shown).

Description is hereinbelow made on the influence of the dummy capacitor Qdw0d or Qdw1d on the dynamic random access memory cell coupled with the associated bit line BLr or BLf. A data bit stored in the dynamic random access memory cell is in the form of electric charges, and the dynamic random access memory cell retains the data bit over time period proportional to the amount of the electric charges. The amount of the electric charges EC is given by Equation 1.

$$EC = C_s \times V_r \text{ (coulomb)} \qquad \text{Equation 1}$$

where Cs is the capacitance of the storage capacitor CP1. When the associated word line is lifted to high voltage level, the storage capacitor CP1 of the dynamic random access memory cell is conducted to the associated right bit line BLr, and the electric charges flow into the right bit line BLr. The storage capacitor CP1 is balanced with the right bit line BLr, and small differential voltage dVd takes place between the right bit line BLr and the left bit line BLf. Since the left bit line BLf is maintained at Vcc/2, the small differential voltage dVd is equal to voltage variation on the right bit line BLr, and is given by Equation 2.

$$dVd = V_r \times C_s / C_b \qquad \text{Equation 2}$$

where Cb is the total capacitance coupled with the right bit line BLr and with the input/output node N2, and the total capacitance Cb is much larger than the capacitance Cs of the storage capacitor CP1. The small differential voltage dVd is supplied to the input/output nodes N1 and N2, and the sense amplifier circuit 1a develops the small differential voltage dVd.

The dynamic random access memory cell stores a data bit of either logic "1" or logic "0" level, and the data bit produces the small differential voltage. However, if the data bit is of logic "1" level corresponding to the high voltage level, the dynamic random access memory cell hardly produces the small differential voltage dVd, because electric charges are liable to be discharged as leakage current and recombined due to alpha particles. In order to assist a data bit of logic "1" in producing the small differential voltage, the dummy cell driving circuit 2 pulls the bit line coupled with non-accessed memory cell down, and the associated input/output node of the sense amplifier circuit 1a is also pulled down. The variation on the bit line is assumed to be dVdw, the differential voltage Vdin applied between the input/output nodes N1 and N2 is enlarged as follows.

$$dVin = dVdw + dVd \qquad \text{Equation 3}$$

Thus, the dummy cell driving circuit 2 increases the small differential voltage between the input/output nodes N1 and N2, and prevents the sense amplifier circuit 1a from malfunction.

However, a problem is encountered in the prior art dynamic random access memory device in that the fabrication process is complex. This is because of the fact that the dummy capacitors Qdw0D and Qdw1D are implemented by depletion type field effect transistors. The depletion type field effect transistors require more than ten steps such as channel doping with arsenic independent from steps for fabricating enhancement type field effect transistors. As described hereinbefore, the dynamic random access memory cells, the transfer transistors and the sense amplifier circuits are fabricated from enhancement type field effect transistors, and the depletion type field effect transistors make the process sequence complex.

Another problem inherent in the prior art dynamic random access memory device is that the dummy capacitors Qdw0D and Qdw1D occupy a large amount of real estate. If 16 Mbit memory cells are incorporated in the dynamic random access memory device, the dynamic random access memory device requires about thirty thousand pairs of dummy capacitors, and each dummy capacitor occupies a substantial amount of real estate. If the occupation area of each dummy capacitor is decreased, the dummy capacitor can not effectively achieve the above described effect, and malfunction is liable to take place. For this reason, the total amount of occupation area is not ignorable, and the large number of dummy capacitors arrest the progressive development in memory capacity.

SUMMARY OF THE INVENTION

It is therefore an important object of the present invention to provide a dynamic random access memory device which is fabricated on a small semiconductor chip through a simple process.

To accomplish the object, the present invention proposes to confine rapid voltage drop at one of input/output nodes of a shared sense amplifier circuit so as to cause undershoot to take place.

In accordance with the present invention, there is provided a semiconductor memory device fabricated on a single semiconductor chip, comprising: a) a first memory cell array having a plurality of first memory cells arranged in rows and columns and respectively storing data bits, each of the first memory cells being implemented by a series combination of a storage capacitor and a first enhancement type field effect transistor; b) a plurality of first bit line pairs each having first and second bit lines respectively associated with adjacent two columns of the plurality of first memory cells; c) a plurality of first word lines respectively associated with the rows of the first memory cells, and selectively driven for allowing the associated first memory cells to be conducted with the first bit lines or with the second bit lines; d) a second memory cell array having a plurality of second memory cells arranged in rows and columns and respectively storing data bits, each of the second memory cells being implemented by a series combination of a storage capacitor and an enhancement type second field effect transistor; e) a plurality of second bit line pairs each having third and fourth bit lines respectively associated with adjacent two columns of the plurality of second memory cells; f) a plurality of second word lines respectively associated with the rows of the second memory cells, and selectively driven for allowing the associated second memory cells to be conducted with the third bit lines or with the fourth bit lines; g) a plurality of shared sense amplifier circuits respectively associated with the plurality of first bit line pairs and with the plurality of second bit line pairs, and each having first and second input and output nodes; h) a plurality of first enhancement type transfer transistors coupled between the first and second bit lines and the first and second input nodes of the plurality of shared sense amplifier circuits; i) a plurality of second enhancement type transfer transistors coupled between the third and fourth bit lines and the first and second input nodes of the plurality of shared sense amplifier circuits, the plurality of first enhancement type transfer transistors and the plurality of second enhancement type transfer transistors complementarily turning on and off for coupling one of the first and second memory cell arrays with the plurality of shared sense amplifier circuits; and j) a plurality of dummy cell pairs respectively associated with the plurality of shared sense amplifier circuits, and each comprising a third enhancement type field effect transistor having source and drain nodes coupled with the first input and output node of the associated shared sense amplifier circuit and a fourth enhancement type field effect transistor having source and drain nodes coupled with the second input and output node of the associated shared sense amplifier circuit, one of the third and fourth enhancement type field effect transistors being driven by a dummy word line driver circuit when the one of the third and fourth enhancement type field effect transistors is associated with one of the first to fourth bit lines coupled with non-selected memory cell.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
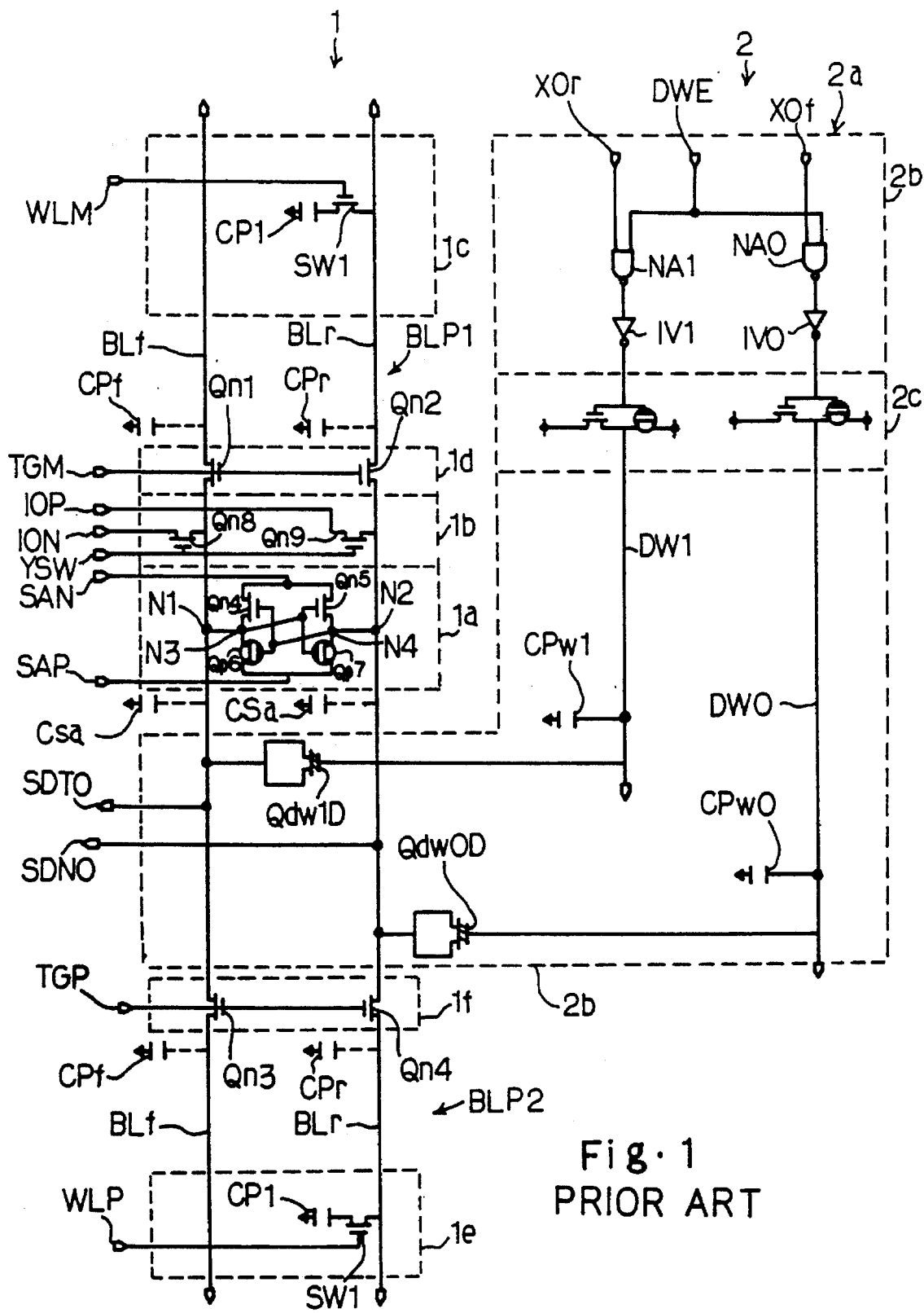
FIG. 1 is a circuit diagram showing the arrangement of the prior art dynamic random access memory device.
Figure 2:
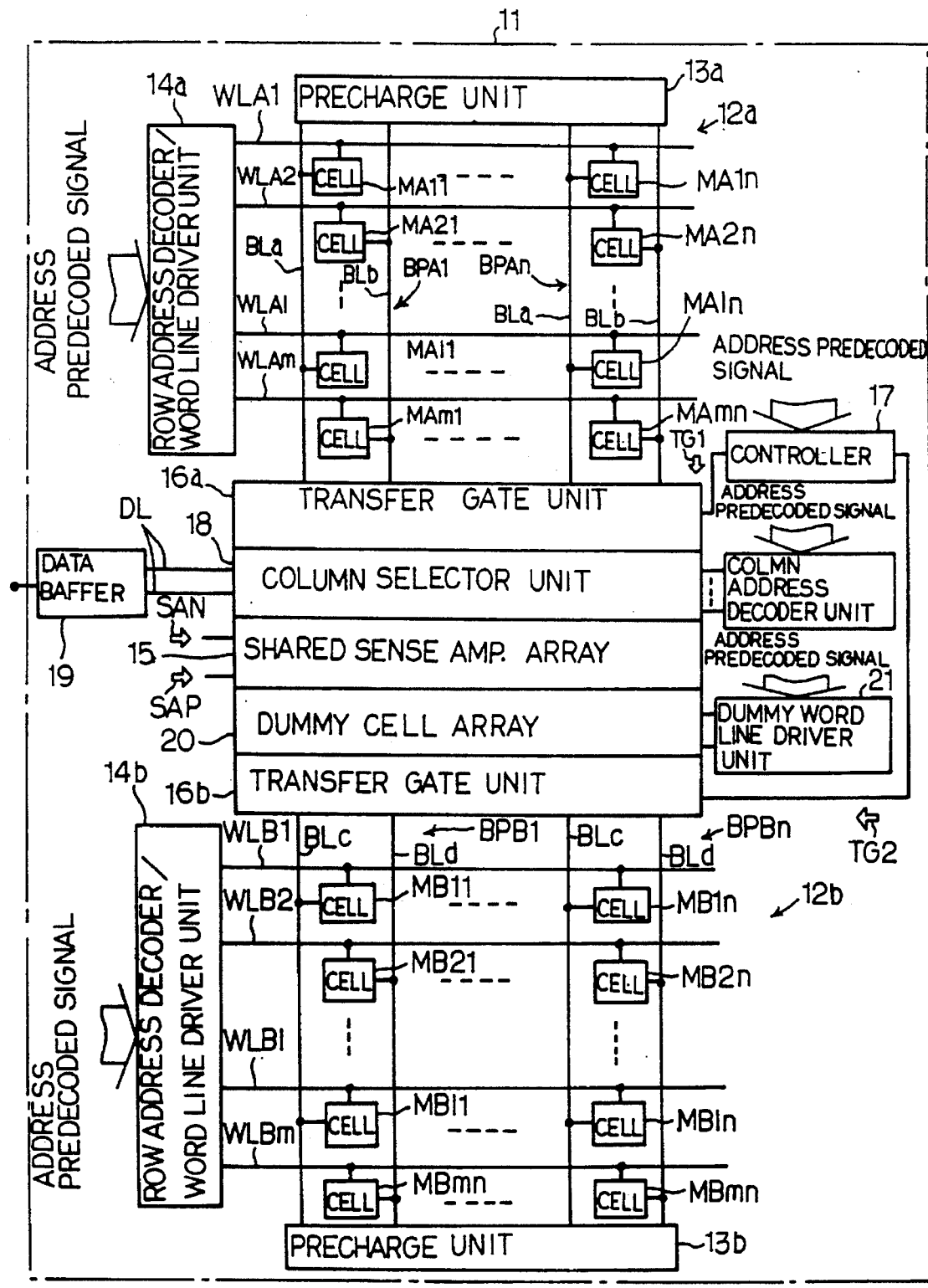
FIG. 2 is a block diagram showing the arrangement of a dynamic random access memory device according to the present invention.

Referring to FIG. 2 of the drawings, a dynamic random access memory device embodying the present invention is fabricated on a single semiconductor chip 11, and largely comprises at least two memory cell arrays 12a and 12b, and peripheral circuits. The memory cell array 12a is implemented by a plurality of one-transistor one-capacitor type memory cells MA11, MA1n, MA21, MA2n, MAl1, MAln, MAm1 and MAmn arranged in rows and columns, and word lines WLA1 to WLAm are respectively associated with the rows of the memory cell array 12a for read-out operations and write-in operations. A plurality of first bit line pairs BPA1 to BPAn are associated with the columns of the memory cell array 12a, and each first bit line pair consists of a first bit line BLa and a second bit line BLb. The rows of the memory cells MA11 to MAmn are alternately coupled with the first and second bit lines BLa and BLb, and the memory cells MA11 to MAmn are selectively conducted with the associated bit lines BLa and BLb.

The other memory cell array 12b is similarly constructed. Namely, the memory cell array 12b is implemented by a plurality of one-transistor one-capacitor type memory cells MB11, MB1n, MB21, MB2n, MBl1, MB1n, MBm1 and MBmn arranged in rows and columns, and word lines WLB1 to WLBm are respectively associated with the rows of the memory cell array 12b. A plurality of second bit line pairs BPB1 to BPBn are associated with the columns of the memory cell array 12b, and each second bit line pair consists of a third bit line BLc and a fourth bit line BLd. The rows of the memory cells MB11 to MBmn are alternately coupled with the third and fourth bit lines BLc and BLd, and the memory cells MB11 to MBmn are selectively conducted with the associated bit lines BLc and BLd. Data bits are stored in the memory cells MA11 to MAmn and MB11 to MBmn in the form of electric charges.

The peripheral circuits is provided for controlling an access to the memory cells MA11 to MAmn and MB11 to MBmn. Precharge units 13a and 13b are respectively coupled with the first bit line pairs BPA1 to BPAn and the second bit line pairs BPB1 to BPBn, and are operative to charge the first and second bit line pairs BPA1 to BPAn and BPB1 to BPBn to the mid point between high voltage level corresponding to logic "1" level and low voltage level corresponding to logic "0" level. In this instance, the high voltage level and the low voltage level correspond to a power voltage level Vcc and the ground voltage level, and, for this reason, the first to fourth bit lines BLa, BLb, BLc and BLd are charged to Vcc/2.

The word lines WLA1 to WLAm and the word lines WLB1 to WLBm are respectively coupled with row address decoder/word line driver units 14a and 14b, and are responsive to predecoded signals of an row address signal so that the row address decoder/word line driver units 14a and 14b selectively drives the word lines WLA1 to WLAm and WLB1 to WLBm. When one of the word lines WLA1 to WLAm and WLB1 to WLBm is driven by the associated row address decoder/word line driver unit 14a or 14b, the associated row of the memory cells are simultaneously conducted with the associated bit lines BLa, BLb, BLc or BLd, and small differential voltage levels take place between the associated bit lines and the adjacent bit lines paired therewith. Since row addresses are respectively assigned to the word lines WLA1 to WLAm and WLB1 to WLBm, only one of the word lines WLA1 to WLAm and WLB1 to WLBm is selected by the row address decoder/word line driver units 14a and 14b.

A shared sense amplifier array 15 is provided for the memory cell arrays 12a and 12b, and has a plurality of shared sense amplifier circuits. The first bit line pairs BLA1 to BLAn are respectively associated with the second bit line pairs BLB1 to BLBn, and each shared sense amplifier circuit is shared between one of the first bit line pairs BLA1 to BLAn and one of the second bit line pairs BLB1 to BLBn. The shared sense amplifier circuits are powered with power voltage signals SAN and SAP, and develop the small differential voltage levels on one of the associated bit line pairs.

The circuit arrangement of each shared sense amplifier circuit will be described hereinlater.

A transfer gate unit 16a is coupled between the first bit line pairs BPA1 to BPAn and the shared sense amplifier array 15, and is responsive to a gate control signal TG1. Similarly, a transfer gate unit 16b is coupled between the second bit line pairs BLB1 to BLBn and the shared sense amplifier array 15, and is responsive to a gate control signal TG2. A controller 17 monitors the address precharged signal indicative of a row address, and allows either gate control signal TG1 or TG2 to go up to an active level.

A column selector unit 18 is coupled between the shared sense amplifier array 15 and a data line pair DL, and the data line pair DL in turn is coupled with a data buffer circuit 19. The column selector unit 18 is responsive to decoded signals of a column address signal, and couples one of the first and second bit line pairs BLPA1 to BPAn and BPB1 to BPBn with the data line pair DL.

A dummy cell arrays 20 is provided in association with the shared sense amplifier array 15, and the dummy cell arrays 20 is implemented by n-channel enhancement type field effect transistors as will be described hereinlater. This means that the steps for fabricating depletion type transistors are deleted from a process sequence for fabricating the dynamic random access memory device, and the process sequence is simpler than the prior art fabrication process. The dummy cell array 20 is driven by a dummy word line driver unit 21, and the dummy word line driver unit 21 causes the dummy cell array 20 to pull the bit lines coupled with non-accessed memory cells down.

Although other peripheral circuits such as a timing generator and an internal step-down circuit are further incorporated in the dynamic random access memory device, no description is made on those peripheral circuits, because they are less important for the gist of the present invention.

Figure 3:
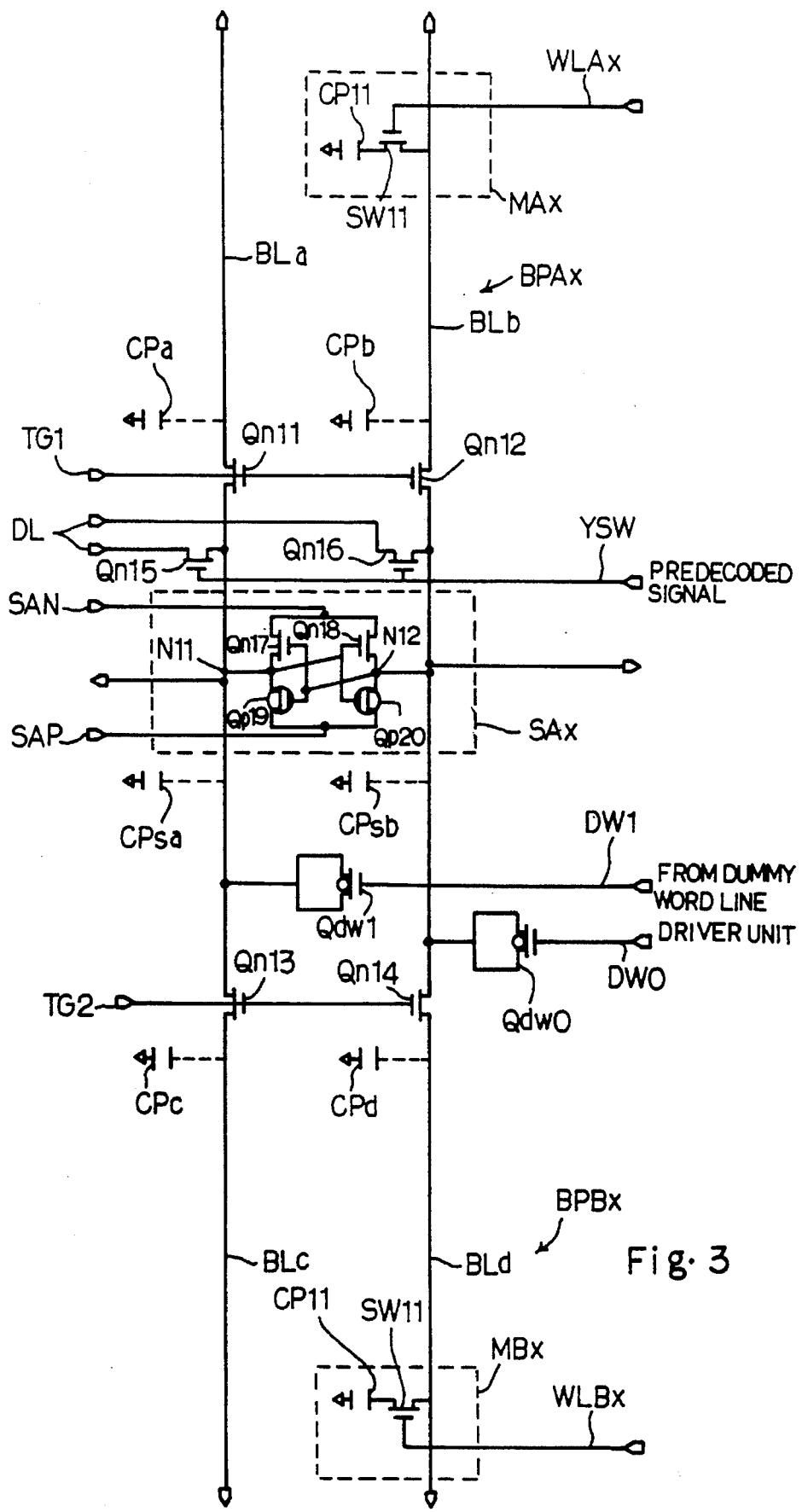
FIG. 3 is a circuit diagram showing one of the shared sense amplifier circuits associated with two bit lines pairs.

Turning to FIG. 3 of the drawings, a local arrangement of the dynamic random access memory device is illustrated, and is focused on one of the shared sense amplifier circuits SAx associated with one of the first bit line pairs BPAx paired with a second bit line pair BPBx. One of the memory cells MA11 to MAmn is coupled with the second bit line BLb, and is labeled with MAx. Similarly, one of the memory cells MB11 to MBmn is coupled with the fourth bit line BLd, and is labeled with MBx. Each of the memory cells MAx and MBx is implemented by a series combination of an n-channel enhancement type switching transistor SW11 and a storage capacitor CP11 coupled between the associated bit line BLb or BLd and a constant voltage line, and the word lines WLAx and WLBx are coupled with the gate electrodes of the n-channel enhancement type switching transistors SW11. CPa, CPb, CPc and CPd stand for parasitic capacitances coupled with the first to fourth bit lines BLa to BLd, respectively.

N-channel enhancement type transfer transistors Qn11 and Qn12 are coupled between the first and second bit lines BLa and BLb and input/output nodes N11 and N2 of the shared sense amplifier circuit SAx, and form parts of the transfer gate unit 16a. Similarly, n-channel enhancement type transfer transistors Qn13 and Qn14 form parts of the transfer gate unit 16b, and are coupled between the third and fourth bit lines BLc and BLd and the input/output nodes N11 and N12. The input/output nodes N11 and N12 are further coupled with n-channel enhancement type transfer transistors Qn15 and Qn16 which form parts of the column selector unit 18, and parasitic capacitances coupled with the input/output nodes N11 and N12 are labeled with CPsa and CPsb.

The n-channel enhancement type transfer transistors Qn15 and Qn16 are responsive to a predecoded signal YSW of the column address signal.

The shared sense amplifier circuit SAx comprises two series combinations of n-channel enhancement type field effect transistors Qn17 and Qn18 and p-channel enhancement type field effect transistors Qp19 and Qp20 coupled in parallel between the power voltage lines for the power voltage signals SAN and SAP, and the input/output nodes N11 and N12 are coupled with the gate electrodes of the field effect transistors Qn18 and Qp20 and with the gate electrodes of the field effect transistors Qn17 and Qp19, respectively. The small differential voltage is applied between the input/output nodes N11 and N12, and allows the field effect transistors Qn17 and Qp19 and the field effect transistors Qn18 and Qp20 to complementarily turn on and off. As a result, the small differential voltage is rapidly developed by the shared sense amplifier circuit Sax.

Dummy cells QdW0 and Qdw1 are implemented by n-channel enhancement type field effect transistors, and form parts of the dummy cell array 20 respectively associated with the input/output nodes N11 and N12 of the shared sense amplifier circuit SAx. The n-channel enhancement type field effect transistors Qdw0 and Qdw1 have relatively low threshold level rather than the other n-channel enhancement type field effect transistors. The source and drain nodes of each dummy cell Qdw0 or Qdw1 are coupled with the associated input/output node N11 or N12, and dummy word lines DW0 and DW1 are coupled with the gate electrodes of the dummy cells Qdw0 and Qdw1. As similar to the prior art, the dummy word line driver unit 21 selectively drives either dummy word line DW0 or DW1 for pulling one of the input/output nodes N11 and N12 down.

Figure 4:
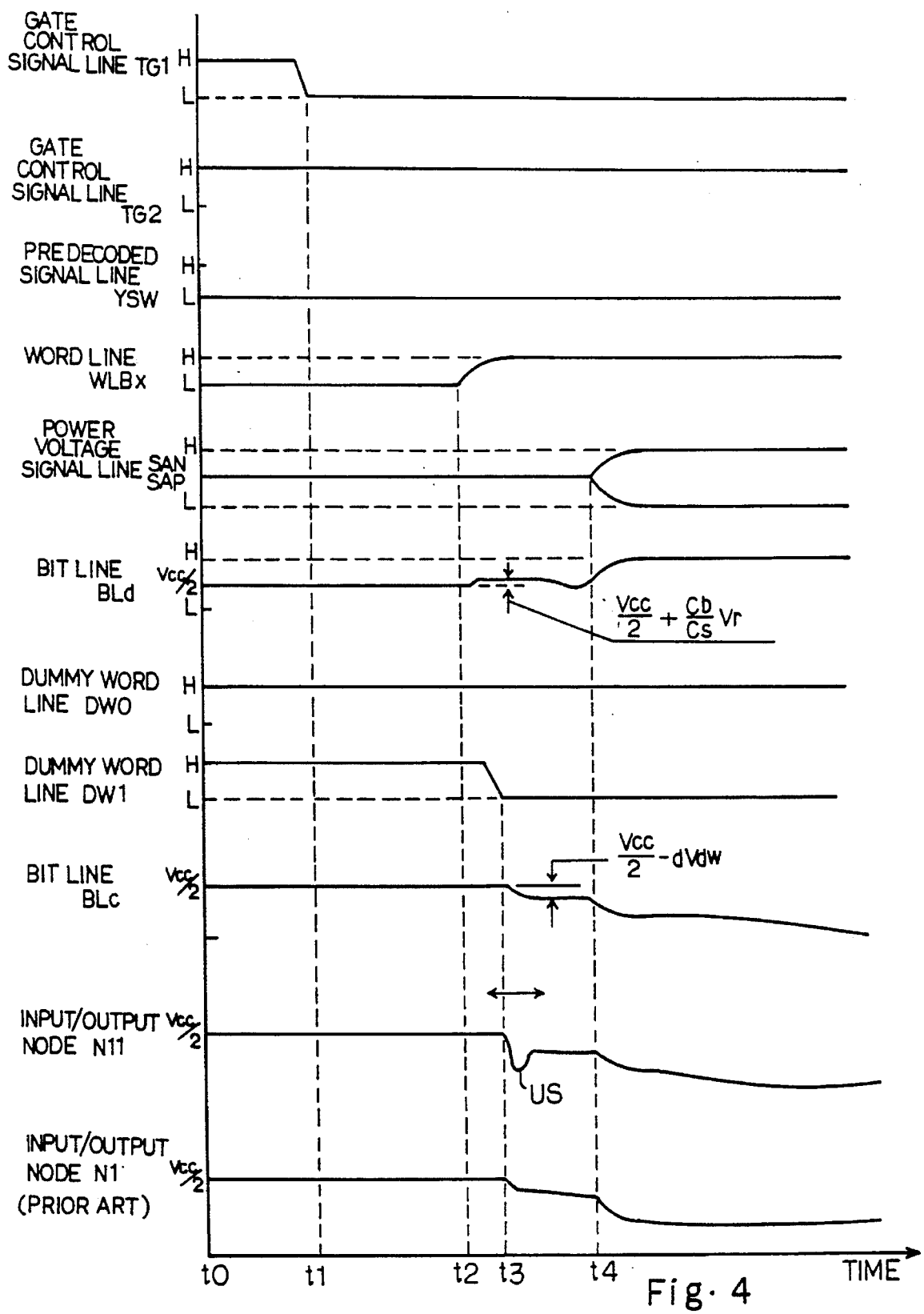
FIG. 4 is a diagram showing the waveforms of essential signals produced in the dynamic random access memory device according to the present invention.

Description is hereinbelow made on circuit behavior of the dynamic random access memory device with reference to FIG. 4 on the assumption that the memory cell MBx is accessed, and the memory cell MBx is assumed to store a data bit of logic "1" level corresponding to the high voltage level. In FIG. 4, "H" and "L" are indicative of high voltage level corresponding to logic "1" level and low voltage level corresponding to logic "0" level. However, "H" does not always indicate a common value. For example, "H" for the word line WLBz is higher than the power voltage level.

The precharge units 13a and 13b complete the charging operation on the first to fourth bit lines BLa to BLd before time t0, and the first and third bit lines BLa and BLc are balanced with the associated second and fourth bit lines BLb and BLd at the mid point Vcc/2 between the high and low voltage levels. The gate control signal TG2 keeps high, and the third and fourth bit lines BLc and BLd are conducted with the input/output nodes N11 and N12 of the shared sense amplifier circuit SAx. However, the gate control signal TG1 goes down to the low voltage level at time t1 so that the shared sense amplifier circuit SAx is blocked from the first and second bit lines BLa and BLb.

If the word line WLBx is boosted over the power voltage level Vcc at time t2, the n-channel enhancement type switching transistor SW11 of the memory cell MBx turns on, and the data bit stored therein allows the fourth bit line BLd to be slightly lifted from the mid point Vcc/2. However, the third bit line BLc is kept at the precharged level Vcc/2. The fourth bit line BLd reaches a balanced level Vbld given by Equation 4.

$$Vbld=(Vcc/2)+Vr \times Cb/Cs \qquad \text{Equation 4}$$

where Vr is a restore level at the storage capacitor CP11, Cs is the capacitance of the storage capacitor CP11 and Cb is the total capacitance of Cs and CPsa.

In this situation, the accessed memory cell MBx is coupled with the fourth bit line BLd, and the third bit line BLc is coupled with non-accessed memory cells. For this reason, the dummy word line driver 21 allows the dummy word line DW1 to go down at time t3, and keeps the other dummy word line DW0 high. As a result, the third bit line BLc goes down by a certain value dVdw, and the voltage level Vblc on the third bit line BLc is given by Equation 5.

$$Vblc=(Vcc/2)-dVdw \qquad \text{Equation 5}$$

This means that the differential voltage DVcd between the third and fourth bit lines BLc and BLd are slightly expanded as Equation 6.

$$DVcd=(Vr \times Cb/Cs)+dVdw \qquad \text{Equation 6}$$

The differential voltage DVcd is initially applied between the input/output nodes N11 and N12 of the shared sense amplifier circuit SAx. The influence of the dummy memory cell Qdw1 is hereinlater described in detail with reference to FIG. 5.

The power voltage signals SAN and SAP are supplied to the shared sense amplifier circuit SAx at time t4, and the shared sense amplifier circuit develops the differential voltage DVcd into large differential voltage. The input/output node N11 is decayed to the low voltage level, and the other input/output node N12 reaches the power voltage level Vcc. Although not shown in FIG. 4, the decoded signal YSW goes up, and the n-channel enhancement type transfer transistors Qn15 and Qn16 relay the large differential voltage through the data line pair DL to the data buffer circuit 19. Moreover, the high voltage level of the large differential voltage is restored in the memory cell MBx.

Figure 5:
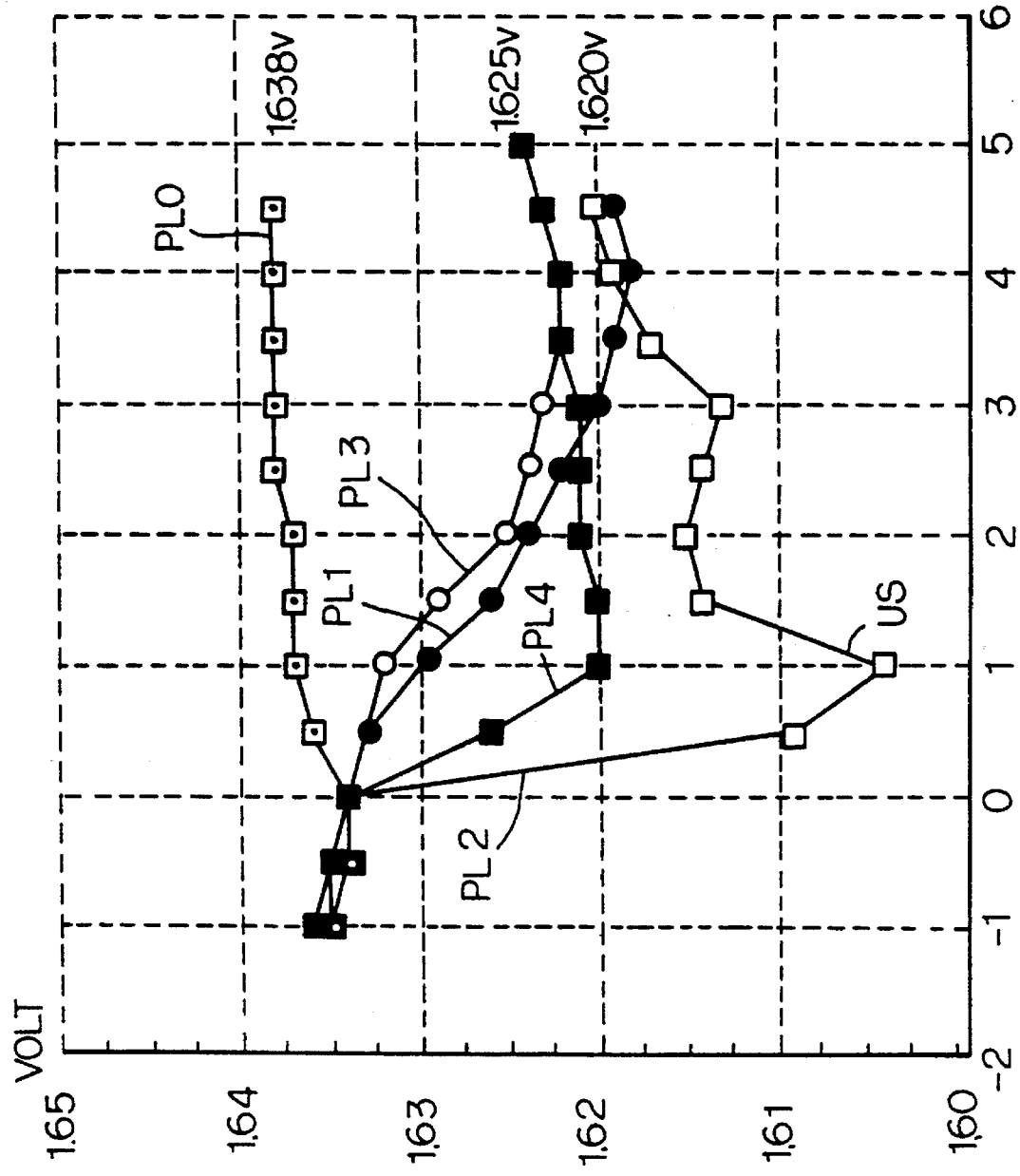
FIG. 5 is a graph showing influence of a dummy cell on an associated input/output node of the shared sense amplifier circuit.

FIG. 5 shows waveforms on the input/output node N11 of the shared sense amplifier circuit SAx, and the waveforms are simulated on the assumption that the third and fourth bit lines BLc and BLd and, accordingly, the input/output nodes N11 and N12 are balanced at Vcc/2 or 1.65 volts. The dummy word line DW1 is assumed to go down at zero corresponding to time t3. If the dummy word line DW1 does not go down, the input/output node N11 traces plots PL0, and is slightly decreased to 1.638 volts due to capacitive coupling upon voltage drop of the gate control signal TG1. However, the other input/output node N12 is also affected by the capacitive coupling, and the influence on the input/output node N31 is canceled by that on the other input/output node N32. This means that the small differential voltage is not affected by the capacitive coupling upon the voltage drop of the gate control signal TG1. Plots PL1 and plots PL2 stand for the third bit line BLc and the input/output node N11 of the shared sense amplifier circuit SAx, respectively.

Comparing plots PL1 between zero to 1 nanosecond with plots PL2, the third bit line BLc is gently decayed; however, undershoot US takes place at the input/output node N11 only. The enhancement type dummy cell Qdw1 and the channel resistance of the transfer transistor Qn13 cause the input/output node N11 to be undershot. Namely, the voltage level at the input/output node N11 is transferred through the conductive channel of the n-channel enhancement type transfer transistor Qn13 to the third bit line BLc, and the conductive channel provides resistance against the current from the input/output node N11 to the third bit line BLc. The violent voltage drop at the source and drain nodes of the enhancement type dummy cell Qdw1 is confined into the input/output node N11 due to the channel resistance of the n-channel enhancement type transfer transistor Qn13, and the channel resistance causes the third bit line BLc to gently go down. This phenomenon is hereinbelow referred to as "confinement effect".

The bit line BLf and the input/output node N1 of the prior art are gently decayed as indicated by plots PL3 and plots PL4, and any confinement effect does not take place, because the prior art depletion type dummy cell does not violently pull the bit line BLf down. Namely, the prior art depletion type dummy cell capacitively couples the dummy word line with the associated bit line at all times, and the prior art bit line is gently decayed together with the dummy word line. On the other hand, the enhancement type dummy cell Qdw1 theoretically serves as a capacitor while the dummy word line DW1 is higher than the precharged level Vcc/2 by the threshold level Vth of the enhancement type dummy cell Qdw1, i.e., from the power voltage level Vcc to the certain level ((Vcc/2)+Vtn). When the dummy word line DW1 passes the certain level, the enhancement type dummy call Qdw1 rapidly turns off, and undershoot tends to take place at the associated input/output node N11. If the dummy word line DW1 is slowly decayed, the enhancement type dummy cell Qdw1 theoretically behaves. However, the actual enhancement type dummy cell Qdw1 dynamically behaves. While the dummy word line DW1 is decayed, the enhancement type dummy cell Qdw1 pulls the source and drain nodes thereof down, and the confinement effect causes the input/output node N11 to be undershot. This means that the undershoot stretches the service time of the enhancement type dummy cell Qdw1, and the input/output node N11 is deeply decayed rather than the prior art input/output node N1. In fact, if the prior art depletion type dummy cell is equivalent in size to the enhancement type dummy cell Qdw1 of the present invention, the prior art depletion type dummy cell merely pulls the input/output node N1 down by 13 millivolt, and the enhancement type dummy cell Qdw1 according to the present invention effectively pulls the input/output node N11 by 18 millivolt. In other words, even if the enhancement type dummy cell is smaller than the prior art depletion type dummy cell, the small-sized enhancement type dummy cell is equivalent to the large-sized prior art depletion type dummy cell, and, accordingly, the dynamic random access memory device according to the present invention can be fabricated on a small semiconductor chip without sacrifice of the differential voltage initially applied between the input/output nodes of the shared sense amplifier circuit.

When the conductive channel as well as the source and drain nodes are pulled down, injection carriers are produced around the conductive channel. However, the value dVdw is much smaller than the precharged level Vcc/2, and the injection carriers are taken up by the source and drain nodes. For this reason, the injection carriers hardly flow into the semiconductor substrate.

Figure 6:
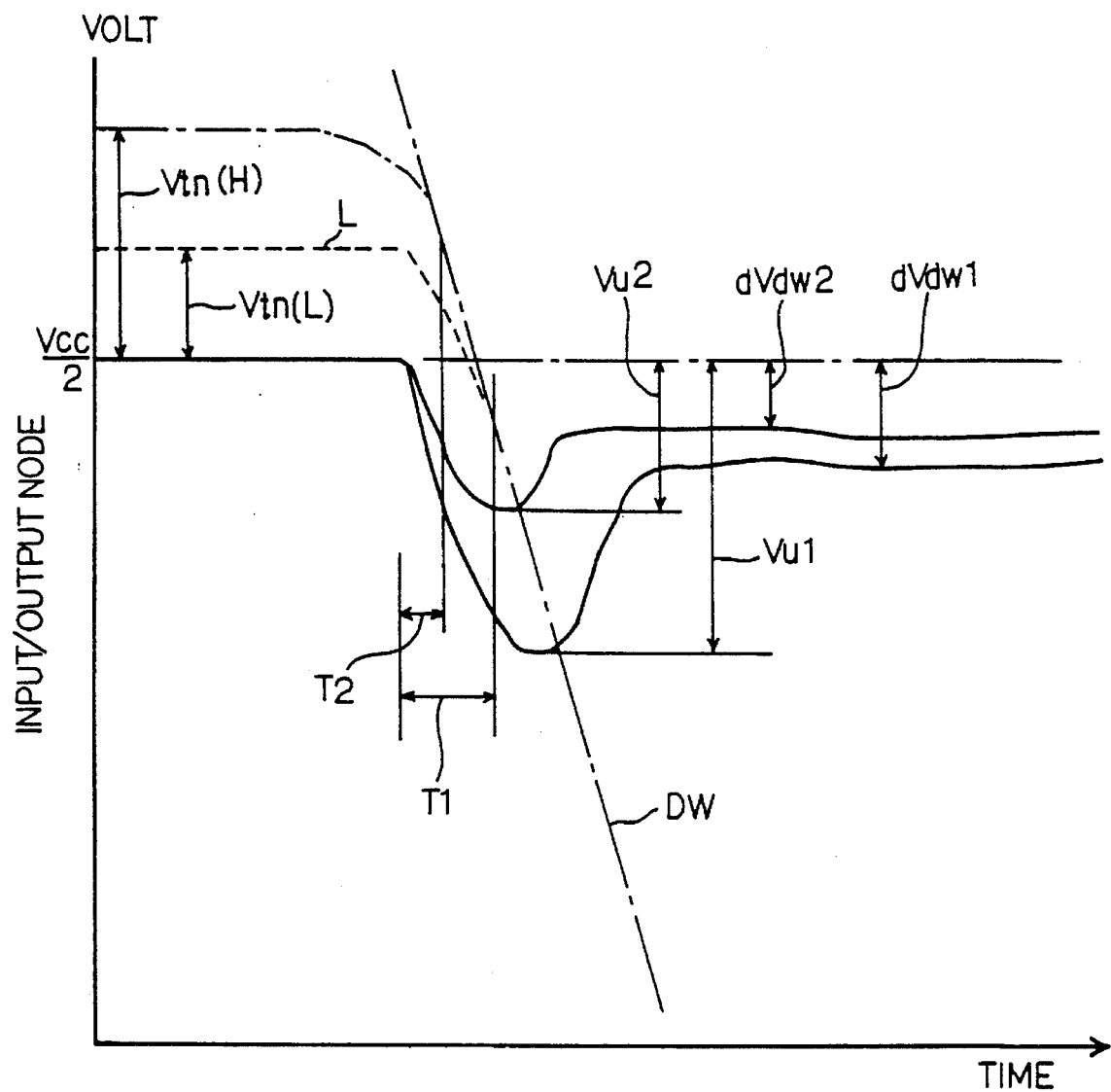
FIG. 6 is a graph showing relation between the threshold of the dummy cell and undershoot produced at an input/output node of a shared sense amplifier circuit.

As described hereinbefore, the enhancement type dummy cells Qdw0 and Qdw1 have small threshold. This feature is attractive in view of deep undershoot. If an enhancement type dummy cell has relatively small threshold Vtn(L), the enhancement type dummy cell serves as a capacitor for time period T1 until the dummy word line reaches a low threshold voltage level L, i.e., (Vtn(L)+Vcc/2) in FIG. 6. If the associated dummy word line goes down along dot-and-dash line, the enhancement type dummy cell deeply pulls the input/output node down as indicated by "Vu1". However, if the enhancement type dummy cell has relatively large threshold, the enhancement type dummy cell capacitively couples the dummy word line with the source and drain nodes thereof while the dummy word line goes down along a dot-and-dash line DW from the power voltage level Vcc to a high threshold voltage level H, i.e., (Vtn(H)+Vcc/2), and serves as the capacitor for time period T2. Thus, the time period is shrunk from T1 to T2, and, accordingly, the undershoot becomes shallow as labeled with Vu2. After recovered from the undershoots Vu1 and Vu2, the enhancement type dummy cell with the small threshold level Vtn(L) keeps relatively large difference dVdw1, and the enhancement type dummy cell with the large threshold level Vtn(H) keeps relatively small difference dVdw2. Thus, the smaller threshold level the enhancement type dummy cell has, the larger differential voltage the associated input/output node keeps, and enhancement type field effect transistors with small threshold is desirable for the dummy cells. The enhancement type dummy cells are operative on the input/output nodes N11 and N12 charged to Vcc/2, and the circumstances are equivalent to a bulk field effect transistor formed in a semiconductor substrate negatively biased at Vcc/2. For this reason, the enhancement type dummy cells are under the serious back gate biassing phenomenon, and the apparent threshold level becomes larger. This is another reason why the enhancement type dummy cells should have lower threshold level.

In the first embodiment, the enhancement type dummy cells or the transistors Qdw0 and Qdw1 have a threshold lower than that of the n-channel enhancement type transfer transistors Qn11 to Qn14 as well as than the n-channel enhancement type field effect transistors Qn17 and Qn18 incorporated in the shared sense amplifier circuit SAx.

As will be understood from the foregoing description, the dynamic random access memory device is fabricated through a simple process sequence, because enhancement type field effect transistors form the component circuits. Moreover, the enhancement type dummy cells deeply pull the associated input/output nodes of the shared sense amplifier circuits down in cooperation with the enhancement type transfer transistors, and, accordingly, can be scaled down without sacrifice of the effect of the dummy cells. This results in scaling down of the dynamic random access memory device or, alternatively, enlarged memory cell arrays. If the enhancement type dummy cells according to the present invention is incorporated in a 16 megabit dynamic random access memory device designed in accordance with 0.5 micron design rules, only 1 squire-millimeter is occupied by the enhancement type dummy cell array.

Second Embodiment

Figure 7:
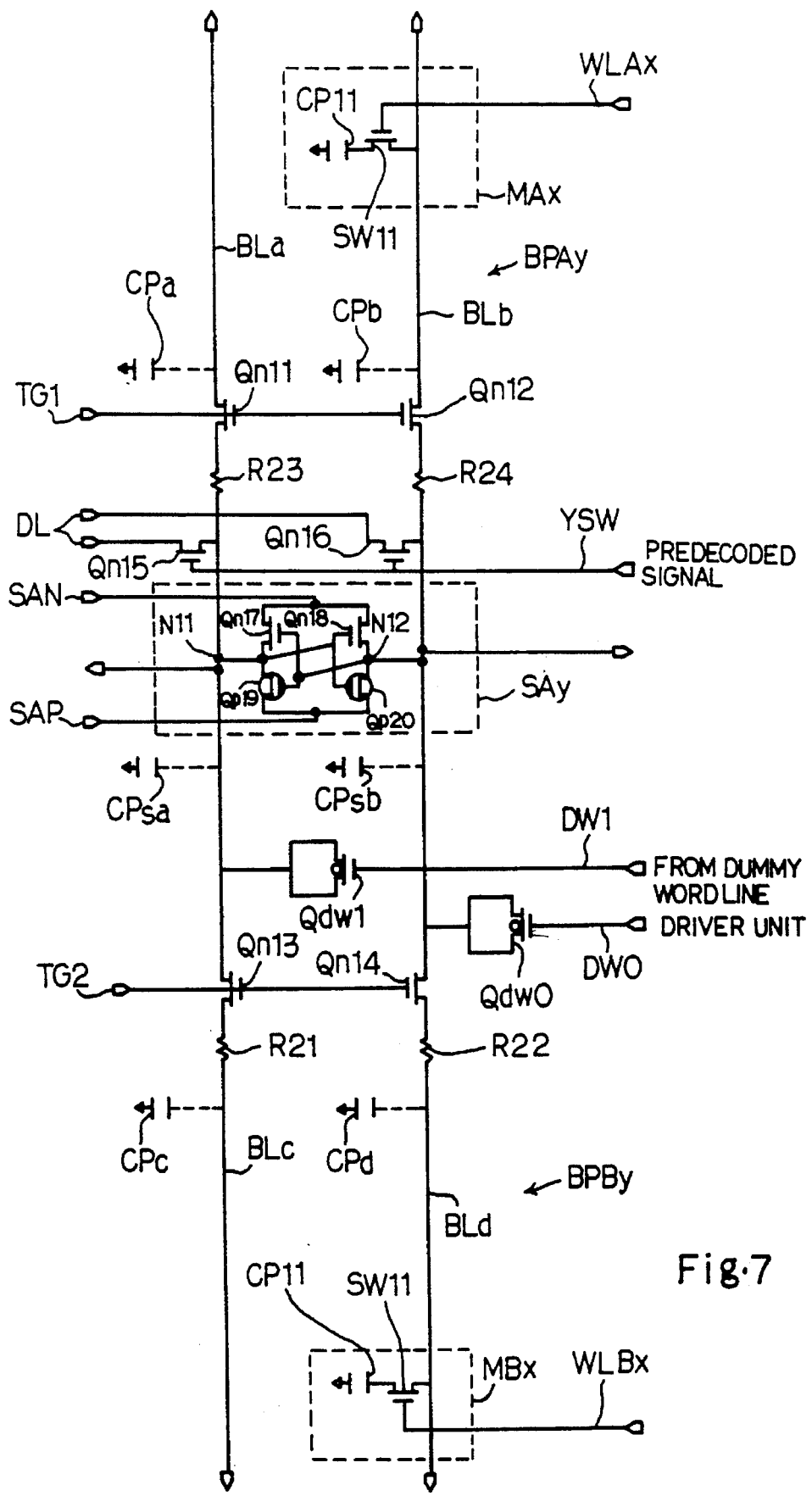
FIG. 7 is a circuit diagram showing a local circuit arrangement of another dynamic random access memory device according to the present invention.

Turning to FIG. 7 of the drawings, a shared sense amplifier circuit SAy is provided in association with a first bit line pair BPAy and a second bit line pair BPBy, and the shared sense amplifier circuit SAy and the first and second bit line pairs BPAy and BPBy are incorporated in another dynamic random access memory device embodying the present invention. However, the dynamic random access memory device partially shown in FIG. 7 is similar to that shown in FIGS. 2 and 3 except for resistors R21, R22, R23 and R24, and, for this reason, the circuit components are labeled with the same references designating the corresponding circuit components of the first embodiment without detailed description.

The resistors R21 and R22 are coupled between the n-channel enhancement type transfer transistors Qn13 and Qn14 and the third and fourth bit lines BLc and BLd, and the resistors R23 and R24 are coupled between the input/output nodes N11 and N12 and the n-channel enhancement type transfer transistors Qn11 and Qn12. The advantage of the resistors R21 and R22 is similar to that of the resistors R23 and R24, and description is made on the resistors R21 and R22 only. As described hereinbefore, the channel resistances of the transfer transistors Qn13 and Qn14 assist the enhancement type dummy cells Qdw1 and Qdw0 in the confinement effect. The resistors R21 and R22 increase the resistances against the current flowing into the third and fourth bit lines BLc and BLd, and, accordingly, promote the confinement effect. By virtue of the resistors R21 and R22, the difference dVdw is larger than that of the first embodiment, and allows the enhancement type dummy cells to be further scaled down.

If the n-channel enhancement type transfer transistors Qn13 and Qn14 are increased in channel resistance, the n-channel enhancement type transfer transistors Qn13 and Qn14 achieve the same function as the resistors R21 and R22. The n-channel enhancement type transfer transistors Qn11 to Qn14 may be larger in channel resistance than the n-channel enhancement type transfer transistors Qn15 and Qn16. In order to increase the channel resistance, the channel width of the transfer transistors Qn13 and Qn14 may be decreased, and dopant concentration in the channel regions may be decreased. Even if the n-channel enhancement type transfer transistors Qn13 and Qn14 are identical with those of the first embodiment, the active level of the gate control signal TG1 is lowered, the channel resistances of the transfer gates Qn13 and Qn1 4 are decreased, and are equivalent to the resistors R21 and R22.

However, if the impedances between the input/output nodes N11 and N12 and the first to fourth bit lines BLa to BLd are too large to promptly propagate data bits in the form of small differential voltage, the access speed is deteriorated. Therefore, it is desirable to increase the resistance at a part of the data propagation path.

The dynamic random access memory device implementing the second embodiment have the advantages of the first embodiment.

Third Embodiment

Figure 8:
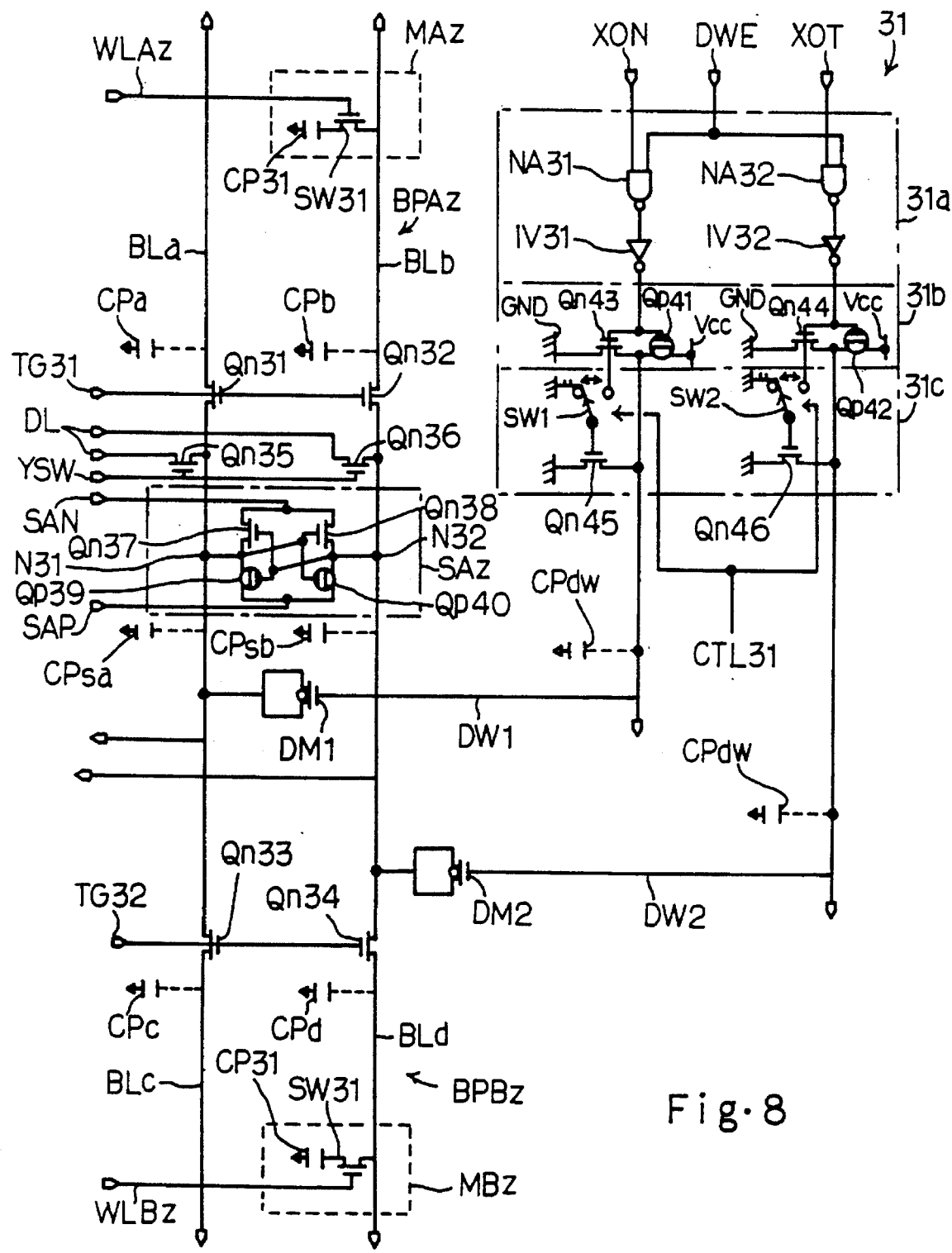
FIG. 8 is a circuit diagram showing a local circuit arrangement of yet another dynamic random access memory device according to the present invention.

Turning to FIG. 8 of the drawings, a shared sense amplifier circuit SAz is accompanied with enhancement type dummy cells DM1 and DM2, and the shared sense amplifier circuit SAz and the enhancement type dummy cells DM1 and DM2 are incorporated in yet another dynamic random access memory device embodying the present invention. Although the dynamic random access memory device implementing the third embodiment is fabricated on a single semiconductor chip as similar to that shown in FIG. 2, only one shared sense amplifier circuit SAz is illustrated in FIG. 8 for the sake of simplicity.

The shared sense amplifier circuits SAz is associated with one of the first bit line pairs BPAz paired with a second bit line pair BPBz, and the first bit line pair BPAz and the second bit line pair BPBz respectively consist of first and second bit lines BLa and BLb and third and fourth bit lines BLc and BLd. One of the memory cells incorporated in a first memory cell array is coupled with the second bit line BLb, and is labeled with MAz. Similarly, one of the memory cells incorporated in a second memory cell array is coupled with the fourth bit line BLd, and is labeled with MBz. Each of the memory cells MAz and MBz is implemented by a series combination of an n-channel enhancement type switching transistor SW31 and a storage capacitor CP31 coupled between the associated bit line BLb or BLd and a constant voltage line, and the word lines WLAz and WLBz are coupled with the gate electrodes of the n-channel enhancement type switching transistors SW31. CPa, CPb, CPc and CPd stand for parasitic capacitances coupled with the first to fourth bit lines BLa to BLd, respectively.

N-channel enhancement type transfer transistors Qn31 and Qn32 are coupled between the first and second bit lines BLa and BLb and input/output nodes N31 and N32 of the shared sense amplifier circuit SAz, and form parts of a first transfer gate unit. Similarly, n-channel enhancement type transfer transistors Qn33 and Qn34 form parts of a second transfer gate unit, and are coupled between the third and fourth bit lines BLc and BLd and the input/output nodes N31 and N32. The n-channel enhancement type transfer transistors Qn31 and Qn32 are gated by a gate control signal line TG31, and a gate control signal line TG32 is coupled with the gate electrodes of the n-channel enhancement type transfer transistors Qn33 and Qn34. The gate control signal lines TG31 and TG32 are complementarily lifted and decayed so that either first or second bit line pair BPAz or BPBz is coupled with the shared sense amplifier circuit SAz.

The input/output nodes N31 and N32 are further coupled with n-channel enhancement type transfer transistors Qn35 and Qn36 which form parts of a column selector unit for transferring developed differential voltage between a data line pair DL and the shared sense amplifier circuit SAz, and parasitic capacitances coupled with the input/output nodes N31 and N32 are labeled with CPsa and CPsb. The n-channel enhancement type transfer transistors Qn35 and Qn36 are responsive to a predecoded signal YSW of the column address signal.

The shared sense amplifier circuit SAz comprises two series combinations of n-channel enhancement type field effect transistors Qn37 and Qn38 and p-channel enhancement type field effect transistors Qp39 and Qp40 coupled in parallel between the power voltage lines for the power voltage signals SAN and SAP, and the input/output nodes N31 and N32 are coupled with the gate electrodes of the field effect transistors Qn38 and Qp40 and with the gate electrodes of the field effect transistors Qn37 and Qp39, respectively. Small differential voltage indicative of a data bit is applied between the input/output nodes N31 and N32, and allows the field effect transistors Qn37 and Qp39 and the field effect transistors Qn38 and Qp40 to complementarily turn on and off. As a result, the small differential voltage is rapidly developed by the shared sense amplifier circuit SAz.

Dummy cells DM1 and DM2 are implemented by n-channel enhancement type field effect transistors, and form parts of a dummy cell array associated with the input/output nodes N31 and N32 of the shared sense amplifier circuit array. The n-channel enhancement type field effect transistors serving as the dummy cells DM1 and DM2 have relatively low threshold level rather than the other n-channel enhancement type field effect transistors such as the n-channel enhancement type transfer transistors Qn31 to Qn34 and the n-channel enhancement type field effect transistors Qn37 and Qn38. The source and drain nodes of each enhancement type dummy cell DM1 or DM2 are coupled with the associated input/output node N31 or N32, and dummy word lines DW1 and DW2 are coupled with the gate electrodes of the enhancement type dummy cells DM1 and DM2. The dummy word lines DM1 and DM2 are selectively driven by a dummy word line driver circuit 31, and the decoded signals XON and XOT of a row address signal causes the dummy word line driver circuit 31 to drive either dummy word line DW1 or DW2 for pulling the associated bit line coupled with non-accessed memory cell down.

The dummy word line driver circuit 31 largely comprises a decoder section 31a, a driver section 31b and an accelerating section 31c. The decoder section 31a comprises NAND gates NA31 and NA32 and inverters IN31 and IN32 respectively coupled with the output nodes of the NAND gates NA31 and NA32. The NAND gates NA31 and NA32 are enabled with an enable signal DWE, and are responsive to the decoded signals XON and XOT, respectively. The driver section 31b comprises two series combinations of p-channel enhancement type field effect transistors Qp41 and Qp42 and n-channel enhancement type field effect transistors Qn43 and Qn44 coupled between the power voltage line Vcc and the ground voltage line GND, and the field effect transistors Qp41 and Qn43 and the field effect transistors Qp42 and Qn44 are respectively gated by the inverters Iv31 and Iv32. The accelerating section 31c comprises an n-channel enhancement type switching transistor Qn45 associated with a switching element SW1 for selectively coupling the gate electrode with either ground voltage line or the output node of the inverter IV31, and an n-channel enhancement type switching transistor Qn46 associated with a switching element SW2 for selectively coupling the gate electrode with either ground voltage line of the output node of the inverter IV32. The switching elements SW1 and SW2 are responsive to a control signal CTL31, and the control signal CTL31 shifts the switching elements SW1 and SW2 from the ground voltage line GND to the output nodes of the inverters IV31 and IV32 in synchronism with the enable signal DWE. CPdw stands for parasitic capacitance coupled to each of the dummy word lines DW1 and DW2.

The dummy word line driver circuit 31 thus arranged behaves as follows. While the bit line pairs BPAz and BPBz are charged and balanced at Vcc/2, the dummy word line enable signal DWE is maintained at the low voltage level, and the NAND gates NA31 and NA32 cause the inverters IV31 and IV32 to produce low voltage signals. The low voltage signals allow the p-channel enhancement type field effect transistors Qp41 and Qp42 to turn on, and the dummy word lines DW1 and DW2 are charged to the high voltage level Vcc. If the row address signal is indicative of the row address assigned to the word line WLAz or WLBz, the memory cell MAz or MBz is the accessed memory cell, and the first or third bit line BLa or BLc is coupled with non-accessed memory cell (not shown). In this situation, after the word line WLAz or WLBz is elevated over the power voltage level Vcc, the enable signal DWE goes up to the high voltage level, and the NAND gates NA31 and NA32 produce a low voltage signal and a high voltage signal from the decoded signal XON of the high voltage level and the decoded signal XOT of the low voltage level, respectively. In other words, the NAND gates NA31 and NA32 cause the associated inverters IV31 and IV32 to supply the high voltage signal and the low voltage signal to the associated series combinations. As a result, the n-channel enhancement type field effect transistor Qn43 turns on, and couples the associated dummy word line DW1 with the ground voltage line GND. However, the p-channel enhancement type field effect transistor Qp42 continuously supplies the power voltage level Vcc to the associated dummy word line DW2. When the enable signal DWE goes up to the active high voltage level, the control signal CTL31 causes the switching elements SW1 and SW2 to couple the output nodes of the inverters IV31 and IV32 with the gate electrodes of the n-channel enhancement type field effect transistors Qn45 and Qn46, and the high voltage signal of the inverter IV31 allows the n-channel enhancement type field effect transistor Qn45 to conduct the associated dummy word line DW1 with the ground voltage line GND. However, the low voltage signal of the inverter IV32 keeps the n-channel enhancement type field effect transistor Qn46 off. For this reason, the dummy word line DW1 is discharged through not only the n-channel enhancement type field effect transistor Qn43 but also the n-channel enhancement type field effect transistor Qn45, and the n-channel enhancement type field effect transistor Qn45 accelerates the discharging operation on the dummy word line DW1. When the dummy word line DW1 is discharged, the voltage level thereon is pulled down, and the associated enhancement type dummy cell DM1 causes the associated input/output node N31 to go down. However, the dummy word line DW2 stays at the power voltage level Vcc, and no voltage drop takes place at the associated input/output node N32. If the row address signal allows a word line (not shown) to conduct a memory cell (not shown) with either first or third bit line BLa or BLc, the dummy word line driver circuit 31 causes the dummy word line DW2 to go down, and the other dummy word line DW1 stays at the power voltage level Vcc.

Figure 9:
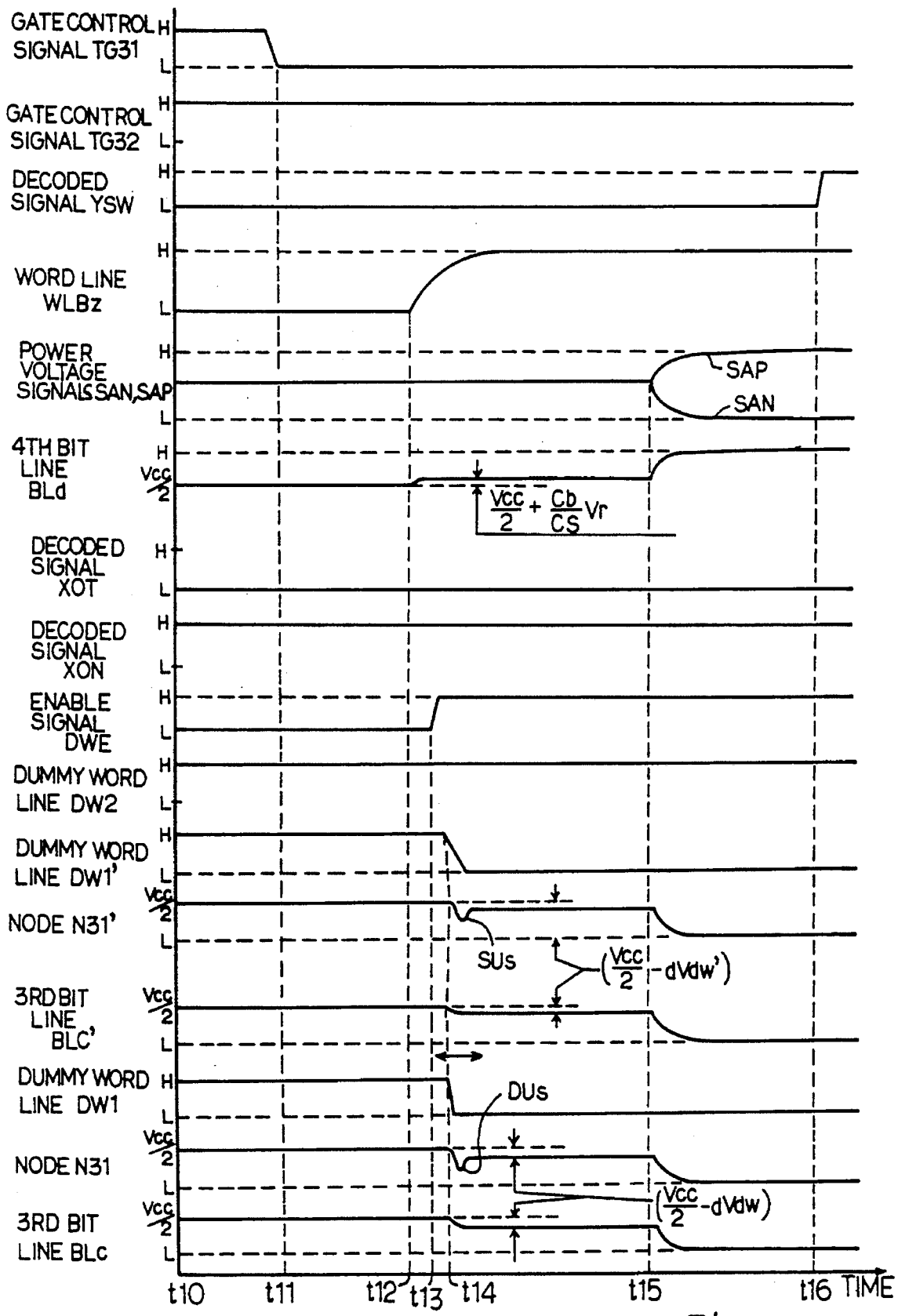
FIG. 9 is a diagram showing the waveforms of essential signal lines incorporated in the dynamic random access memory device.

Description is hereinbelow made on circuit behavior of the dynamic random access memory device shown in FIG. 8 with reference to FIG. 9 on the assumption that the memory cell MBz is accessed. In FIG. 9, "H" and "L" are indicative of high voltage level corresponding to logic "1" level and low voltage level corresponding to logic "0" level. However, "H" does not always indicate a common value. For example, "H" for the word line WLBz is higher than the power voltage level.

Precharge units (not shown) complete the charging operation on the first to fourth bit lines BLa to BLd before time t10, and the first and third bit lines BLa and BLc are balanced with the associated second and fourth bit lines BLb and BLd at the mid point Vcc/2 between the high and low voltage levels H and L. The gate control signal TG32 keeps high, and the third and fourth bit lines BLc and BLd are conducted with the input/output nodes N31 and N32 of the shared sense amplifier circuit SAz. However, the gate control signal TG31 goes down to the low voltage level at time t11 so that the shared sense amplifier circuit SAz is blocked from the first and second bit lines BLa and BLb.

If the word line WLBz is boosted over the power voltage level Vcc at time t12, the n-channel enhancement type switching transistor SW31 of the memory cell MBz turns on, and the data bit stored therein allows the fourth bit line BLd to be slightly lifted from the mid point Vcc/2. However, the third bit line BLc is kept at the precharged level Vcc/2. The fourth bit line BLd reaches a balanced level Vbld given by Equation 7.

$$Vbld = (Vcc/2) + Vr \times Cb/Cs \qquad \text{Equation 7}$$

where Vr is a restore level at the storage capacitor C31, Cs is the capacitance of the storage capacitor CP31 and Cb is the total capacitance of Cs and CPsa.

In this situation, the accessed memory cell MBz is coupled with the fourth bit line BLd, and the third bit line BLc is coupled with non-accessed memory cells. For this reason, the dummy word line driver 31 allows the dummy word line DW1 to go down, and keeps the other dummy word line DW2 high. Namely, the enable signal DWE goes up to the high voltage level at time t13, and the NAND gates NA31 and NA32 are enabled. The decoded signals XOT and XON have already been changed to the low voltage level and the high voltage level, and the NAND gates NA31 and NA32 produce the low voltage signal and the high voltage signal, respectively. The inverters IV31 and IV32 supplies the high voltage signal and the low voltage signal to the driving section 31b. The n-channel enhancement type field effect transistor Qn43 and the p-channel enhancement type field effect transistor Qp42 turn on, and the dummy word lines Dw1 and DW2 are respectively coupled with the ground voltage line and the power voltage line Vcc. The control signal CTL31 has already shifted the switching elements SW1 and SW2 to be coupled with the output nodes of the inverters IV31 and IV32 in synchronous with the enable signal DWE, and the n-channel enhancement type field effect transistor Qn45 turns on together with the n-channel enhancement type field effect transistor Qn43. However, the n-channel enhancement type field effect transistor Qn46 is turned off, and any current path is provided between the dummy word line DW2 and the ground voltage line GND. If the accelerating section 31c is not provided for dummy word lines DW1' and DW2', the dummy word line DW1' is gently decayed at time t14, and an associated enhancement type dummy cell allows relatively shallow undershoot SUs to take place at an associated input/output node N31' of a shared sense amplifier circuit. Therefore, an associated third bit line is slightly pulled down by dVdw'.

However, in this instance, the accelerating section 31c allows the dummy word line DW1 to rapidly go down at time t14. As a result, the input/output node N31 is widely pulled down, and deep undershoot DUs takes place at the input/output node N31 under the confinement effect. When the input/output node N31 is recovered from the deep undershoot DUs, the input/output node N31 is balanced with the third bit line BLc at a certain voltage level Vblc given by Equation 8.

$$Vblc=(Vcc/2)-dVdw \qquad \text{Equation 8}$$

This means that the differential voltage DVcd between the input/output nodes N31 and N32 are slightly expanded as Equation 9.

$$DVcd=(Vr \times Cb/Cs)+dVdw \qquad \text{Equation 9}$$

The differential voltage DVcd initially applied between the input/output nodes N31 and N32 of is developed by the shared sense amplifier circuit SAz if the power voltage signals SAN and SAP are supplied to the shared sense amplifier circuit SAz at time t15. The input/output node N31 is decayed to the low voltage level, and the other input/output node N32 reaches the power voltage level Vcc. If the decoded signal YSW goes up at time t16, and the n-channel enhancement type transfer transistors Qn35 and Qn36 relay the large differential voltage through the data line pair DL to a data buffer circuit (not shown). Moreover, the high voltage level of the large differential voltage is restored in the memory cell MBz.

Figure 10:
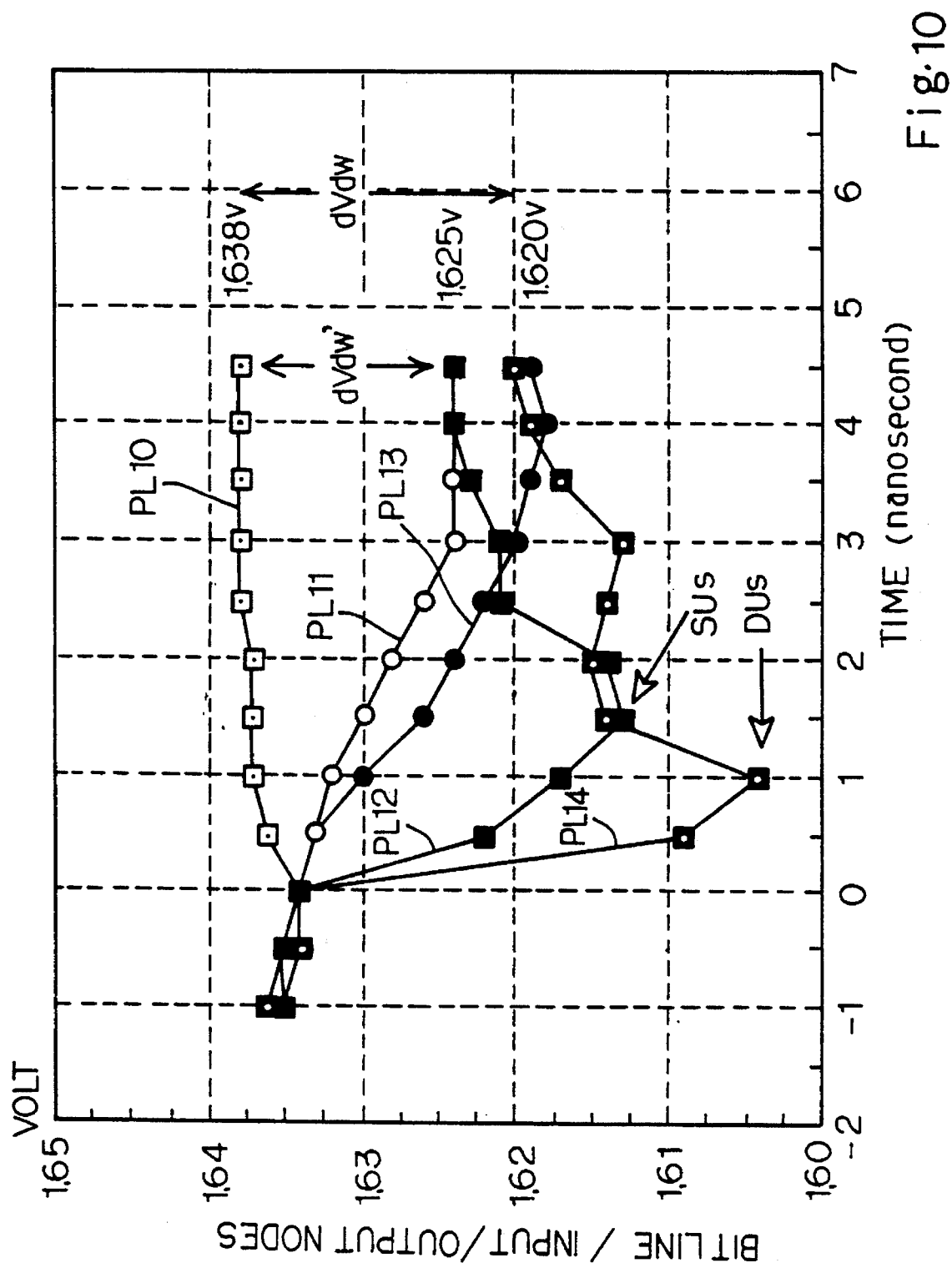
FIG. 10 is a graph showing influence of an accelerating section incorporated in the dynamic random access memory device.

FIG. 9 shows waveforms on the input/output nodes N31 and N31', and the waveforms are simulated on the assumption that the third and fourth bit lines BLc and BLd and, accordingly, the input/output nodes N31 and N32 are balanced at Vcc/2 or 1.65 volts. The waveforms in FIG. 9 are partially enlarged, and are shown in FIG. 10. The dummy word line DW1 is assumed to go down at zero corresponding to time t14. If the dummy word line DW1 does not go down, the input/output node N31 traces plots PL10, and is slightly decreased to 1.638 volts due to capacitive coupling upon voltage drop of the gate control signal TG31. However, the other input/output node N32 is also affected by the capacitive coupling, and the influence on the input/output node N31 is canceled by that of the other input/output node N32. This means that the small differential voltage is not affected by the capacitive coupling upon the voltage drop of the gate control signal TG31.

Plots PL11 and plots PL12 stand for the third bit line BLc and the input/output node N31' without any assistance of the accelerating section 31c, respectively, and plots PL13 and plots PL14 are indicative of the voltage variation on the third bit line BLc and the input/output node N31 assisted by the accelerating section 31c.

Comparing plots PL11 and PL13 with plots PL12 and PL14, the third bit line BLc is gently decayed; however, undershoots SUs and DUs take place at the input/output nodes N31 and N31'. The reason for the undershoots SUs and DUs is described in conjunction with FIG. 5.

If any accelerating section is not provided for any additional current path from the dummy word line DW1 to the ground voltage line GND, the dummy word line DW1 is decayed along an arrow AR1, and the enhancement type dummy cell serves as a capacitor from time t0 to time ts. The enhancement type dummy cell decreases the input/output node N31' to a low voltage level Vu', and the input/output node N31' is recovered from the low voltage level Vu'. The input/output node N31' becomes stable at a constant level lower than the mid level Vcc/2 by dVdw', and the value dVdw is about 13 millivolt.

On the other hand, if the dummy word line DW1 is accelerated by the additional current path, the dummy word line DW1 is decayed along an arrow AR2, and the enhancement type dummy cell DM1 serves as a capacitor from time t0 to time tq. The enhancement type dummy cell DM1 decreases the input/output node N31 to a low voltage level Vu, and is recovered from the low voltage level Vu to a certain level lower than the mid level Vcc/2 by value dVdw. The value dVdw is about 18 millivolt. Thus, the rapid voltage drop on the dummy word line DW1 causes the deep undershoot DUs to take place at the input/output node N31, and keeps the input/output node N31 lower than the input/output node N31'.

The enhancement type field effect transistors serving as the dummy cells DM1 and DM2 have a relatively low threshold level rather than that of the n-channel enhancement type transfer transistors Qn31 to Qn34, and the advantage of the low threshold is described hereinbefore.

Fourth Embodiment

Figure 11:
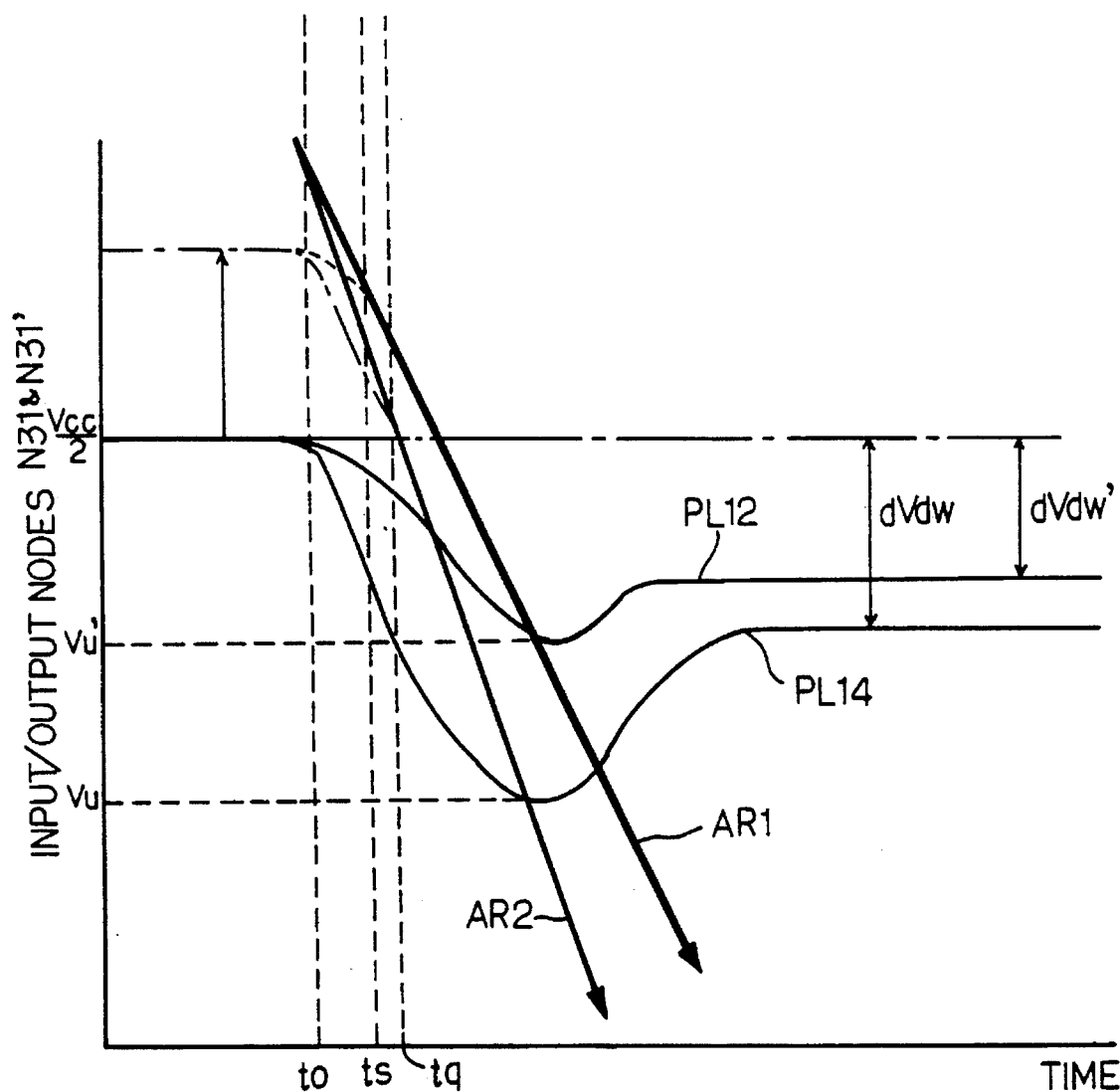
FIG. 11 is a graph showing the voltage level at an associated input/output node of a shared sense amplifier circuit with and without assistance of the accelerating section.
Figure 12:
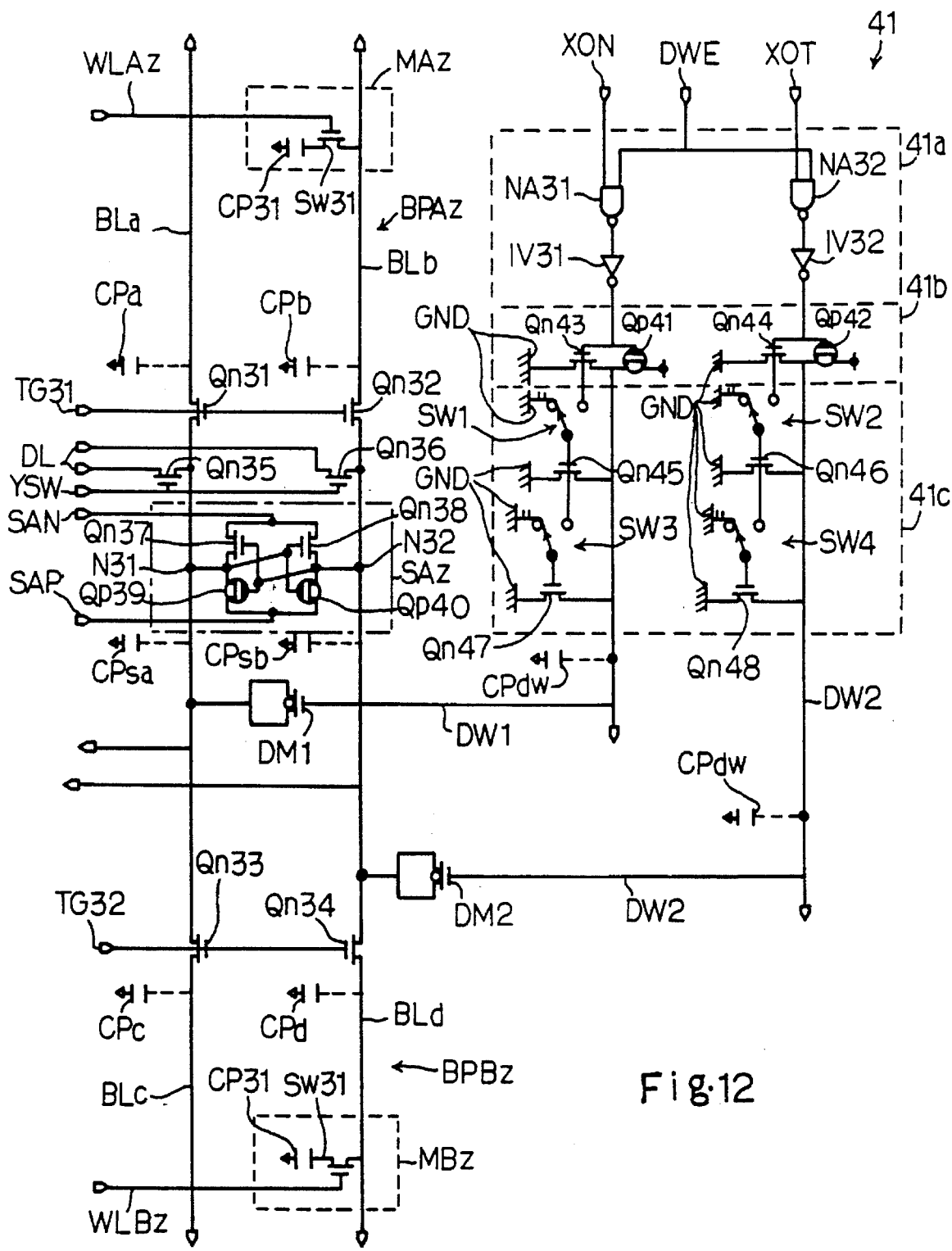
FIG. 12 is a circuit diagram showing an local circuit arrangement of still another dynamic random access memory device according to the present invention.

Turning to FIG. 11 of the drawings, a local circuit arrangement of still another dynamic random access memory device embodying the present invention is illustrated. The dynamic random access memory device shown in FIG. 11 is similar to the third embodiment except for a dummy cell driving circuit 41, and the other circuit components are labeled with the same references designating the corresponding components of third embodiment.

The dummy word line driver circuit 41 largely comprises a decoder section 41a, a driver section 41b and an accelerating section 41c, and the decoder section 41a and the driver section 41b are further similar in circuit arrangement to the decoder section 31a and the driver section 31b. The circuit components of the decoder section 41a and the driver section 41b are designated by the same references as those of the corresponding sections 31a and 31b.

The accelerating section 41c doubles the current paths from the dummy word lines DW1 and DW2 to the ground voltage line GND, and comprises four n-channel enhancement type field effect transistor Qn45, Qn46, Qn47 and Qn48 associated with switching elements SW1, SW2, SW3 and SW4, respectively. The n-channel enhancement type field effect transistors Qn45 and Qn46 are different in current driving capability from the n-channel enhancement type field effect transistors Qn47 and Qn48. The dummy cell driver circuit 41 thus arranged step-wise changes the swing velocity on the selected dummy word line DW1 or DW2. Namely, assuming now that the dummy word line DW1 is selected, both n-channel enhancement type field effect transistors Qn45 and Qn47 are firstly turned off, then a control circuit (not shown) allows one of the n-channel enhancement type field effect transistors Qn45 and Qn47 to turn on, then allowing the other of the n-channel enhancement type field effect transistors Qn45 and Qn47 to turn on, finally both of the n-channel enhancement type field effect transistors Qn45 and Qn47 turn off.

If the time constant of the dummy word lines DW1 and DW2 are sequentially varied, the swing velocity is step-wise changed, and more than four n-channel enhancement type field effect transistors associated with switching elements may be incorporated in an accelerating section forming a part of another dummy cell driving circuit. This feature may be used for regulating the voltage difference dVdw in an inspection stage after completion of the fabrication process.

Although particular embodiments of the present invention have been shown and described, it will be obvious to those skilled in the art that various changes and modifications may be made without departing from the spirit and scope of the present invention. For example, the confinement effect is desirable for differential voltage indicative of a data bit, and the enhancement type dummy cells accompanied with the load resistive elements may be incorporated in another type of a semiconductor memory device. In the fourth embodiment, the n-channel enhancement type field effect transistors Qn45 and Qn46 are different in current driving capability from the other transistors Qn47 and Qn48. However, these field effect transistors Qn45 to Qn47 may be equal in current driving capability.

What is claimed is:

1. A semiconductor memory device comprising:
   a plurality of sense amplifiers each having a first node and a second node;
   a plurality of first bit lines each associated with one of said sense amplifiers and selectively connected to said first node via first transfer gate;
   a plurality of second bit lines each associated with one of said sense amplifiers and selectively connected to said second node via second transfer gate;
   a plurality of word lines;
   a plurality of dummy word lines;
   a plurality of memory cells each associated with one of said word lines and each associated and selectively connected to one of said first bit lines;
   a plurality of dummy cells each associated with one of said dummy word lines and each associated and selectively connected to said second node, each of said dummy cells including an enhancement transistor;
   a word line driver coupled to said plurality of word lines, for selectively activating at least one of said word lines; and
   a dummy word line driver coupled to said plurality of dummy word lines, for selectively activating at least one of said dummy word lines.

2. The semiconductor memory device as claimed in claim 1, wherein said enhancement transistor having a gate electrode connected to said dummy word line and source and drain regions commonly connected to said second node.

3. The semiconductor memory device as claimed in claim 1, wherein said dummy word line driver is equipped with a control means for controlling a driving capability of said dummy word line driver.

* * * * *

UNITED STATES PATENT AND TRADEMARK OFFICE
CERTIFICATE OF CORRECTION

PATENT NO.    : 5,485,427
DATED         : January 16, 1996
INVENTOR(S)   : Sumio OGAWA It is certified that error(s) appears in the above-identified patent and that said Letters Patent is hereby corrected as shown below:

Column 2, line 24, delete "1 a" and insert --1a--.

Column 7, line 13, delete "MB1n" and insert --MBln--.

Signed and Sealed this

Ninth Day of July, 1996

Attest:

BRUCE LEHMAN

Attesting Officer          Commissioner of Patents and Trademarks